(12) United States Patent
Sakuragi

(10) Patent No.: US 6,542,105 B2
(45) Date of Patent: Apr. 1, 2003

(54) A/D CONVERTER

(75) Inventor: Takamasa Sakuragi, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/013,863

(22) Filed: Dec. 13, 2001

(65) Prior Publication Data

US 2002/0109620 A1 Aug. 15, 2002

(30) Foreign Application Priority Data

Dec. 18, 2000 (JP) ........................................ 2000-383924

(51) Int. Cl.[7] .................................................. H03M 1/34
(52) U.S. Cl. ...................... 341/164; 341/155; 341/143; 341/118; 341/120; 341/144
(58) Field of Search ................................. 341/110–899

(56) References Cited

U.S. PATENT DOCUMENTS

| | | | | |
|---|---|---|---|---|
| 4,496,937 A | * | 1/1985 | Kitagawa et al. ........... | 341/110 |
| 4,996,529 A | * | 2/1991 | Connell ...................... | 341/118 |
| 5,262,780 A | * | 11/1993 | Gray ........................... | 341/166 |
| 5,568,141 A | * | 10/1996 | Mori ........................... | 341/118 |
| 5,883,590 A | * | 3/1999 | Sugden et al. ............... | 341/155 |
| 5,920,274 A | * | 7/1999 | Gowda et al. ............... | 341/155 |
| 6,373,266 B1 | * | 4/2002 | Carelli et al. ................ | 324/600 |

* cited by examiner

*Primary Examiner*—Michael Tokar
*Assistant Examiner*—Linh Van Nguyen
(74) *Attorney, Agent, or Firm*—Fitzpatrick, Cella, Harper & Scinto

(57) ABSTRACT

An A/D converter including a counter for counting a clock signal to output a digital signal corresponding to an analog input signal; a D/A converter for converting the output signal of the counter into an analog signal; a comparator for comparing the analog input signal with the output signal of the D/A converter to control the counter in accordance with the comparison result; and a clock supply circuit for supplying the counter with the clock signal, wherein the frequency of the clock signal is changed in accordance with a difference signal exhibiting the difference between the analog input signal and the output signal of the D/A converter.

17 Claims, 10 Drawing Sheets

A/D CONVERTER

BACKGROUND OF THE INVENTION

1. Field of the Invention

The present invention relates to an A/D converter for converting an analog input signal into a digital signal, and an image pickup apparatus employing the same.

2. Related Background Art

FIG. 13 is a circuit block diagram showing a configuration of a conventional A/D converter. In FIG. 13, there is shown an example of an A/D converter wherein a counter 1 and a D/A converter 2 are employed as a ramp waveform generator, and an analog input signal is compared with an output signal of the D/A converter 2 in a comparator 3, thereby carrying out the A/D conversion for the analog input signal. For example, a basic clock signal is inputted to the counter 1, and then the counter 1 carries out the counting-up from zero. The magnitude of an output signal of the D/A converter 2 is also increased along with the counting-up and becomes equal to the magnitude of the analog input signal which is being inputted to the comparator 3, at a certain time so that the polarity of the output signal of the comparator 3 is inverted. The A/D conversion is carried out in such a way that the output signal of the comparator 3 is used to control the operation of the counter 1, and at the time when the polarity of the output signal of the comparator 3 is inverted, the operation of the counter 1 is stopped so that the digital output signal thereof becomes the digital value corresponding to the analog input signal.

FIG. 14 is a circuit block diagram showing a configuration of an example of a solid-state image pickup apparatus in which the A/D converter shown in FIG. 13 is used for the A/D conversion of a sensor output. The A/D converter is constituted of a counter 1, a D/A converter 2, a comparator 3 and an oscillator 4, and this A/D converter is connected to every vertical signal line 6. The sensor has a structure in which sensor cells 5 are arranged in a matrix form of n (row)×m (column) to construct the two-dimensional sensor, and the sensor outputs which are connected to the associated one of the vertical signal lines are transferred to the A/D converter, which is provided in every vertical signal line, by a vertical shift register 7. The counter 1 which has received a clock signal from the oscillator 4, for example, carries out the counting operation from zero, and the output of the D/A converter 2 which receives the digital output therefrom is connected to one of inputs of the comparator 3 the other of which is connected to the associated one of the vertical signal lines 6. Therefore, the analog output voltage is increased along with the counting-up by the counter 1, and at the time when the analog output voltage becomes equal to the magnitude of the sensor output signal, the polarity of the output signal of the comparator 3 is inverted to drive the register 8 in such a way as to store the digital value of the counter 1 at this time. The digital value stored in the associated one of the registers 8 corresponds to the A/D conversion result of each of the sensors, and the digital value thereof is outputted through a terminal 9.

In this conventional A/D converter, the settling time of the output signals of the D/A converter becomes normally longer than a period of time which is the minimum time required for the operation of one count of the counter. For this reason, a period of time required for the comparison operation in the comparator 3 also becomes long along with the increase of the setting time, and hence the conversion speed in the A/D converter is limited by the D/A converter.

As a result, there arises the problem in that it is difficult to enhance the conversion speed. FIG. 15 is a timing chart showing the clock signal inputted to the counter 1 and the output voltage of the D/A converter 2 which is changed along with the input of the clock signal. It is understood from FIG. 15 that a minimum value of the cycle of the clock signal is limited by the settling time of the D/A converter 2.

In addition, if the clock frequency of the counter 1 is increased barely up to the settling time of the D/A converter 2, then the D/A converter 2 is easy to be influenced by the switching noise generated by the counter 1 as the digital circuit. Then, when the difference in magnitude between the output signal of the D/A converter 2 and the analog input signal is small, there also arises the problem in that the possibility that the comparator 3 causes the malfunction due to the switching noise becomes high. In particular, when the sensor as shown in FIG. 14 is employed, the digital circuits which generate the switching noises, such as the register and the counter, may be disposed close to the sensor in many cases. As a result, there arises the problem in that the sensor suffers the influence of the noise to degrade the S/N ratio.

SUMMARY OF THE INVENTION

It is an object of the present invention to provide an A ID converter which is capable of enhancing the A/D conversion speed while maintaining the A/D conversion accuracy, and an image pickup apparatus employing the same.

In order to attain the above-mentioned object, according to one aspect of the present invention, there is provided an A/D converter comprising:

a counter arranged to count a clock signal to output a digital signal corresponding to an analog input signal;

a D/A converter arranged to convert the output signal of the counter into an analog signal;

a comparator arranged to compare the analog input signal with the output signal of the D/A converter to control the counter in accordance with the comparison result; and a clock supply circuit arranged to supply the counter with the clock signal, wherein the frequency of the clock signal is changed in accordance with a difference signal exhibiting the difference between the analog input signal and the output signal of the D/A converter.

Also, according to another aspect of the present invention, there is provided an A/D converter comprising:

a counter arranged to count a clock signal to output a digital signal corresponding to an analog input signal;

a D/A converter arranged to convert the output signal of the counter into an analog signal;

a comparator arranged to compare the analog input signal with the output signal of the D/A converter to control the counter in accordance with the comparison result; and a clock supply circuit arranged to supply the counter with the clock signal, wherein the D/A converter includes an output amplifier, and a bias current which flows through the output amplifier is changed in accordance with a difference signal exhibiting the difference between the analog input signal and the output signal of the D/A converter.

Also, according to another aspect of the present invention, there is provided an A/D converter comprising:

a counter arranged to count a clock signal to output a digital signal corresponding to an analog input signal;

a D/A converter arranged to convert the output signal of the counter into an analog signal;

a comparator arranged to compare the analog input signal with the output signal of the D/A converter to control the counter in accordance with the comparison result; and a clock supply circuit arranged to supply the counter with the clock signal, wherein an output impedance of a gate circuit which is included in at least one of the counter and the clock supply circuit is changed in accordance with a difference signal exhibiting the difference between the analog input signal and the output signal of the D/A converter.

Other objects and features of the present invention will be apparent from the following specification and the figures.

DESCRIPTION OF THE PREFERRED EMBODIMENTS

Figure 1:
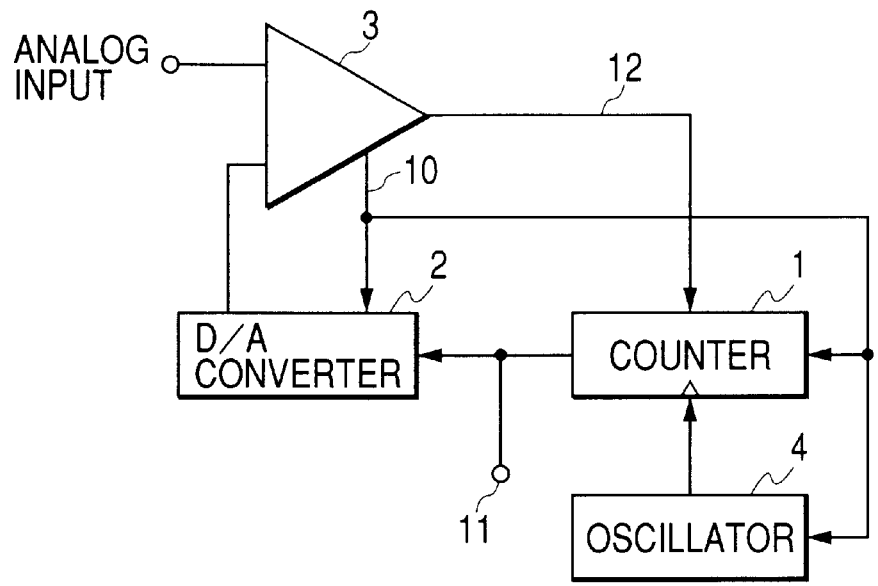
FIG. 1 is a circuit block diagram showing a configuration of a first embodiment of an A/D converter according to the present invention.
Figure 13:
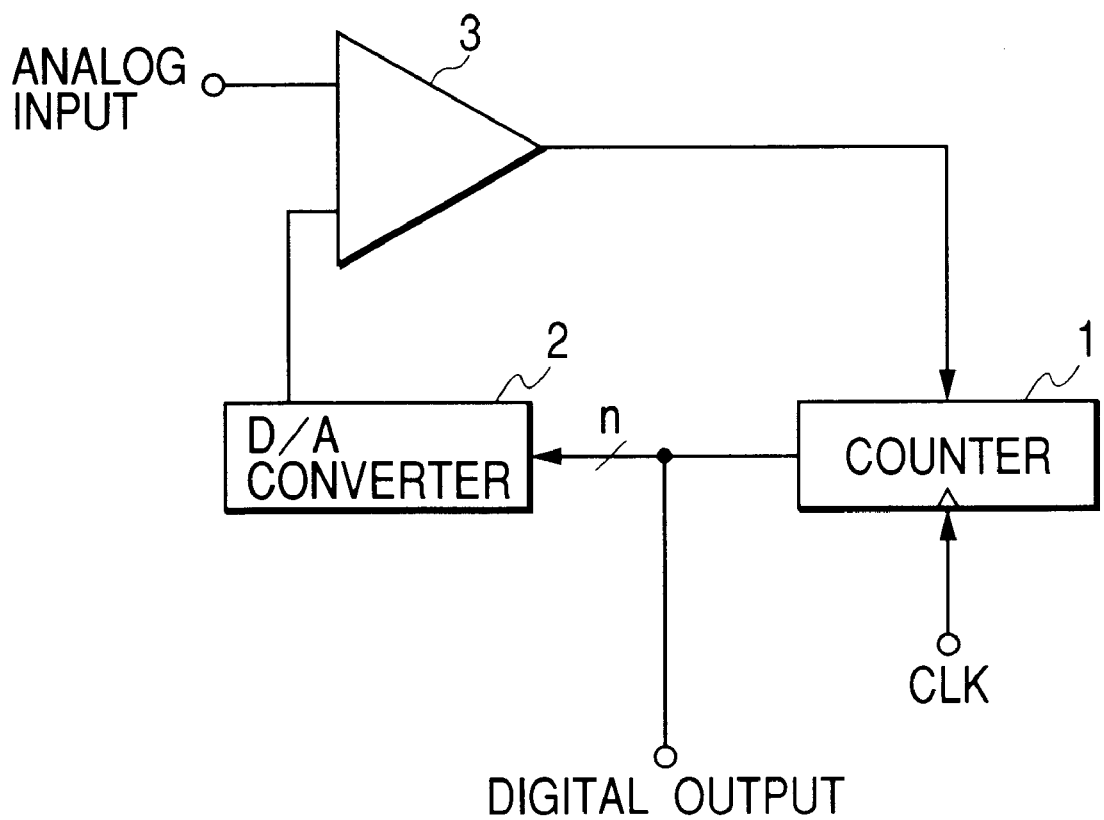
FIG. 13 is a circuit block diagram showing a configuration of a conventional A/D converter.
Figure 14:
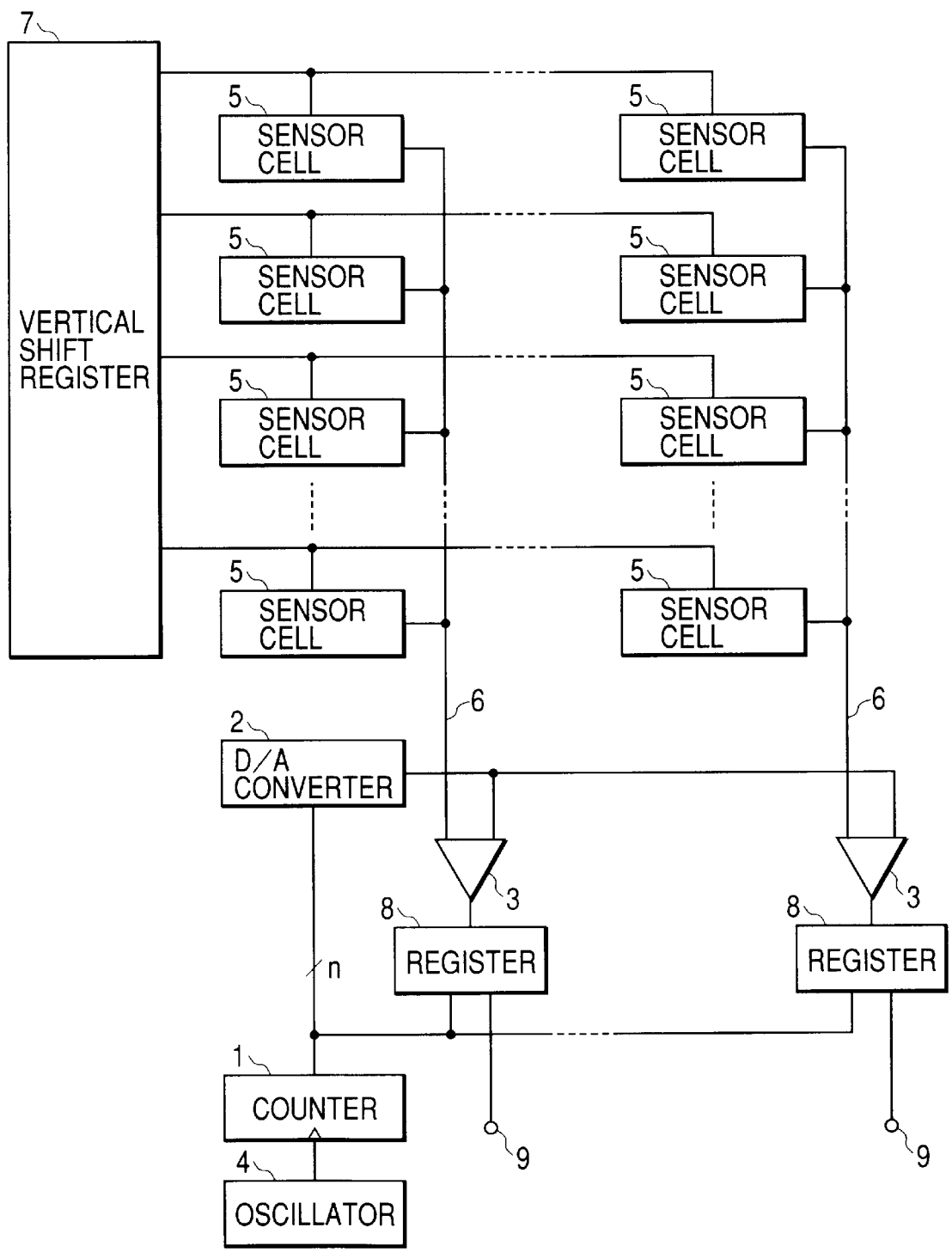
FIG. 14 is a circuit block diagram showing a configuration of a solid-state image pickup apparatus employing the A/D converter shown in FIG. 13.
Figure 15:
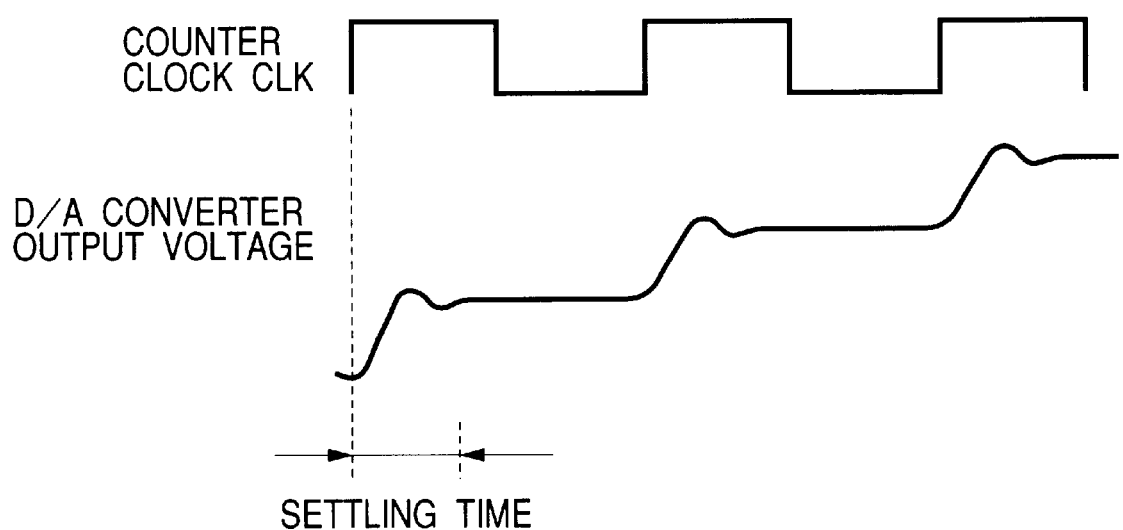
FIG. 15 is a time chart explaining a clock signal of a counter in the A/D converter shown in FIG. 13 and an output signal of a D/A converter.

The preferred embodiments of the present invention will hereinafter be described in detail with reference to the accompanying drawings. FIG. 1 is a circuit block diagram showing a configuration of a first embodiment of an A/D converter according to the present invention. It should be noted that in FIG. 1, the same parts as those of the conventional A/D converter shown in FIG. 13 are designated with the same reference numerals. In FIG. 1, reference numeral 1 designates a counter which is adapted to receive a clock signal generated by an oscillator 4 to carry out the counting operation. An output signal of this counter 1 is inputted to a digital input terminal of a D/A converter 2, and also an analog output signal corresponding to the digital value from the counter 1 is outputted to one terminal of a comparator 3.

An analog input signal is inputted to the other terminal of the comparator 3, and then the comparator 3 compares this analog input signal with an output signal of the D/A converter 2 to output the comparison result as an output signal 12 to the counter 1, thereby controlling the counting operation of the counter 1. Then, the A/D conversion is carried out in such a way that at the time when the analog input signal becomes equal in magnitude to the output signal of the D/A converter, the polarity of the output signal of the comparator 3 is inverted and the counting operation of the counter 2 is stopped in accordance with this inversion, and also the output value of the counter 2 at this time is outputted as the digital signal corresponding to the analog input signal.

In addition, the comparator 3 outputs an another output signal 10. That is, a difference signal 10 exhibiting the magnitude of the difference between the analog input signal and the output signal of the D/A converter 2 is outputted to the oscillator 4, the D/A converter 2 and the counter 1. A reference numeral 11 denotes an output terminal through which the digital signal which has been obtained by the A/D conversion is outputted. The oscillator 4 is designed in such a way as to control the frequency of the clock signal of the oscillator 4 in accordance with the difference signal 10 outputted from the comparator 3. In addition, as will be described in detail later, in the D/A converter 2, the bias current source which is used to control the slew-rate of the output thereof and the ringing is controlled on the basis of the magnitude of the difference signal 10. In addition, in the counter 1, the on-resistance of the transistor which is inserted in series with the associated one of the gates is controlled on the basis of the magnitude of the difference signal 10, and also the output impedance of the gate is controlled, thereby controlling the magnitude of the switching noise.

Figure 2:
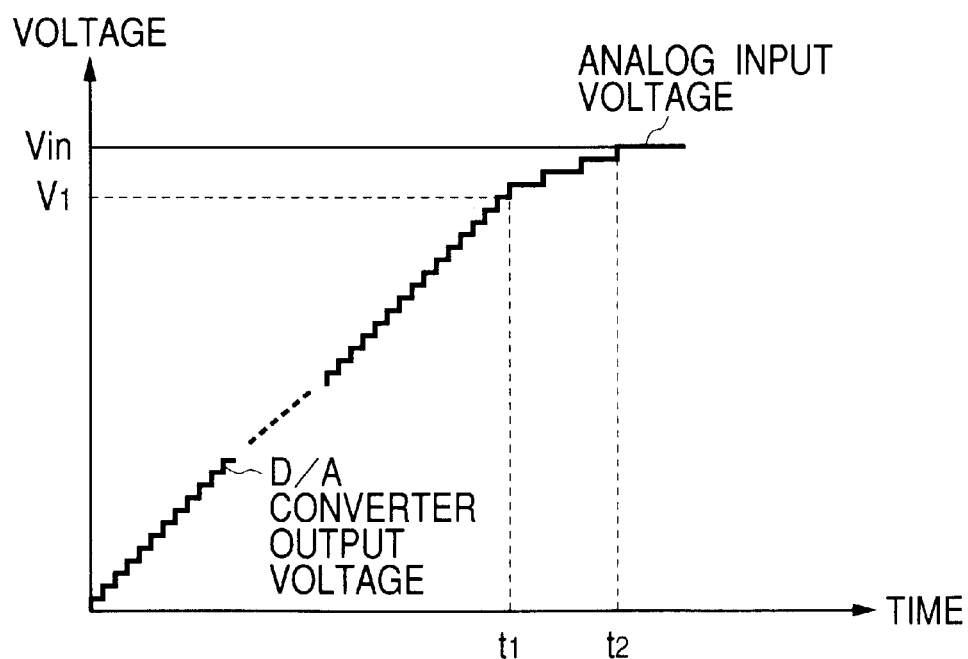
FIG. 2 is a graphical representation explaining the situation in which a clock frequency of an oscillator is changed in accordance with a difference signal of a comparator of the A/D converter shown in FIG. 1.

FIG. 2 is a graphical representation explaining the situation in which the clock frequency of the oscillator 4 is changed in accordance with the magnitude of the difference signal 10 outputted from the comparator 3. In the figure, the axis of abscissa represents time and the axis of ordinate represents the output signal of the D/A converter 2. As can be seen from FIG. 2, the difference between the analog input voltage Vin and the output voltage of the D/A converter 2 is sufficiently large until a time t1, and the clock frequency of the oscillator 4 stays at a maximum value which can be set, and hence that frequency corresponds to the cycle which is shorter than the settling time of the D/A converter 2. At the time t1, the magnitude of the output signal of the D/A converter 2 has reached V1, and at a time point when the difference between the analog input voltage Vin and the output voltage of the D/A converter 2 becomes small, the clock cycle of the oscillator 4 is made longer (in this example, it is made 3 times as long as that thereinbefore) in such a way as to become the larger value than the settling time of the D/A converter 2, which makes it possible that the comparison operation of the comparator 3 is carried out with high accuracy.

Now, as for the oscillator 4, for example, the VCO (voltage controlled oscillator) is employed, and hence it is possible to change the frequency of the clock signal of the oscillator 4 in accordance with the magnitude of the difference signal 10. In addition, while in FIG. 2, at the time t1, the clock cycle is made three times as long as it is before the time t 1, alternatively, the clock cycle may also be changed in accordance with the magnitude of the difference signal.

Figure 3:
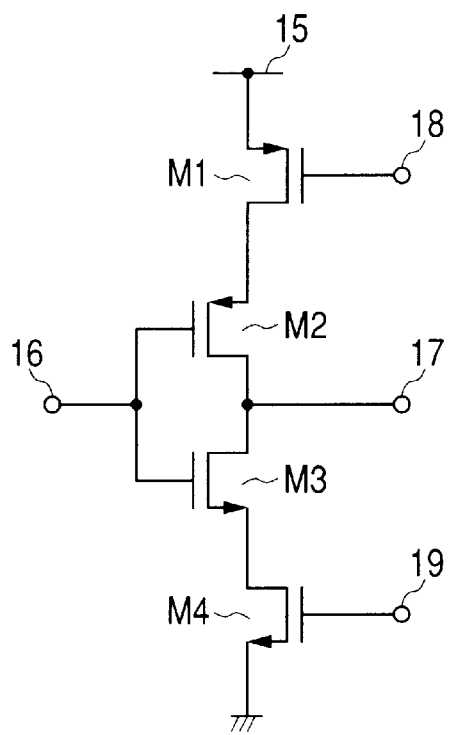
FIG. 3 is a circuit diagram showing a configuration of a gate circuit of a counter.

FIG. 3 shows a configuration of a gate circuit provided in a logic circuit of the counter 1, in particular, a configuration of a circuit for suppressing the switching noise for circuits, such as the comparator, each of which is easy to be influenced by the external switching noise. MOS transistors M1 and M4 are inserted into the gate circuit (in this example, it is a CMOS inverter which is constituted of MOS transistors M2 and M3), to control the gate voltage thereof, whereby the output impedance of the CMOS inverter is controlled in order to control the switching noise. It is noted that in FIG. 3, reference numeral 15 denotes a high potential power source; reference numeral 16 denotes an inverter input terminal; reference numeral 17 denotes an inverter output terminal; and reference numerals 18 and 19 denote respectively input terminals for the difference signal outputted from the comparator 3. The difference signals are inputted from the comparator shown in FIG. 10 which will be described later to the terminals 18 and 19, respectively.

Figure 4:
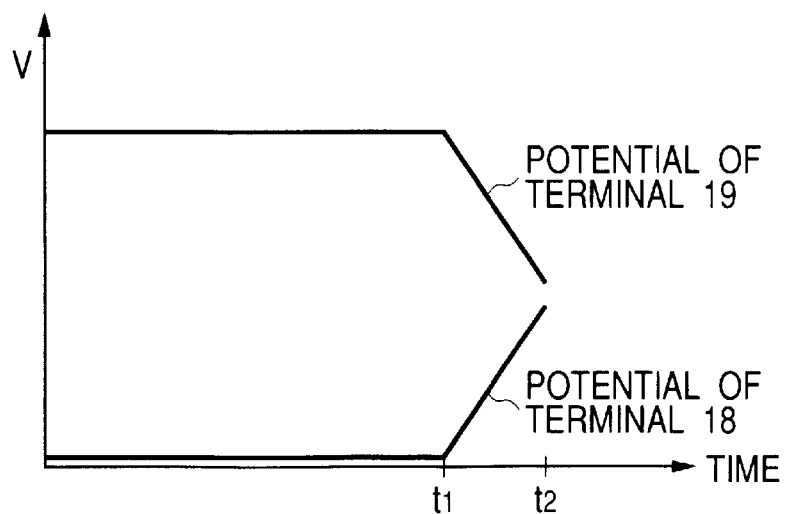
FIG. 4 is a graphical representation explaining a difference signal which is inputted from a comparator to the gate circuit shown in FIG. 3.

Now, when the difference in magnitude between the analog input signal and the output signal of the D/A converter 2 is large until the time t1 in FIG. 2, the voltage of the terminal 18 is at the GND level, the voltage of the terminal 19 is near the voltage of the high potential power source, and hence each of the MOS transistors M1 and M4 is in the ON state. For this reason, the output impedance of the CMOS inverter is low, and hence the setting for making the high speed driving possible is carried out. In addition, by carrying out the setting in such a way that at the time t1 of FIG. 2, the electric potential at the terminal 18 is gradually increased and conversely the electric potential at the terminal 19 is gradually decreased, the output impedance of the inverter becomes larger and hence the high speed driving can not be carried out, whereas the switching noise becomes smaller. This relationship between the input signals to the inverter is shown in FIG. 4. By the way, the circuit shown in FIG. 3 may be provided in each of the gate circuits in the logic circuit constituting the oscillator 4.

Figure 5:
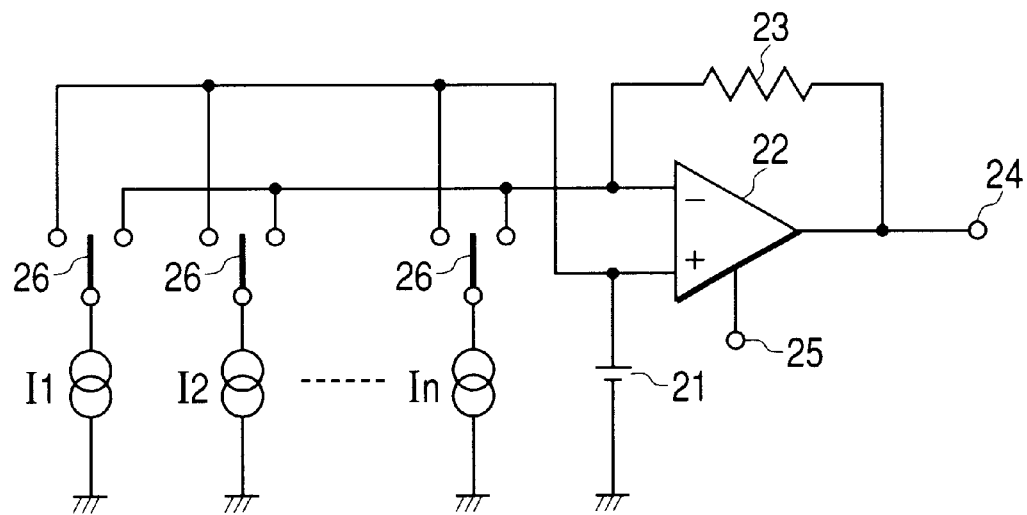
FIG. 5 is a circuit diagram showing a configuration of an example of a D/A converter for use in the A/D converter shown in FIG. 1.

FIG. 5 is a circuit diagram showing a configuration of an example of the typical D/A converter 2. In the figure, symbols I1 to In denote binary current sources, respectively; reference numeral 21 denotes a regulated voltage source; reference numeral 22 denotes a differential amplifier; reference numeral 23 denotes a resistor for converting the associated one of the currents of the binary current sources I1 to In into the voltage; reference numeral 24, an output terminal of the D/A converter; and 25, a terminal which is used to control the bias current of the differential amplifier 22. The difference signal 10 of the comparator 3 is inputted to the terminal 25, and the bias current of the differential amplifier 22 is controlled by the difference signal 10 of the comparator 3. Then, the currents of the binary current sources I1 to In are switched by switches 26 to convert the associated one of the currents into the voltage. In such a manner, the D/A conversion is carried out.

Figure 6:
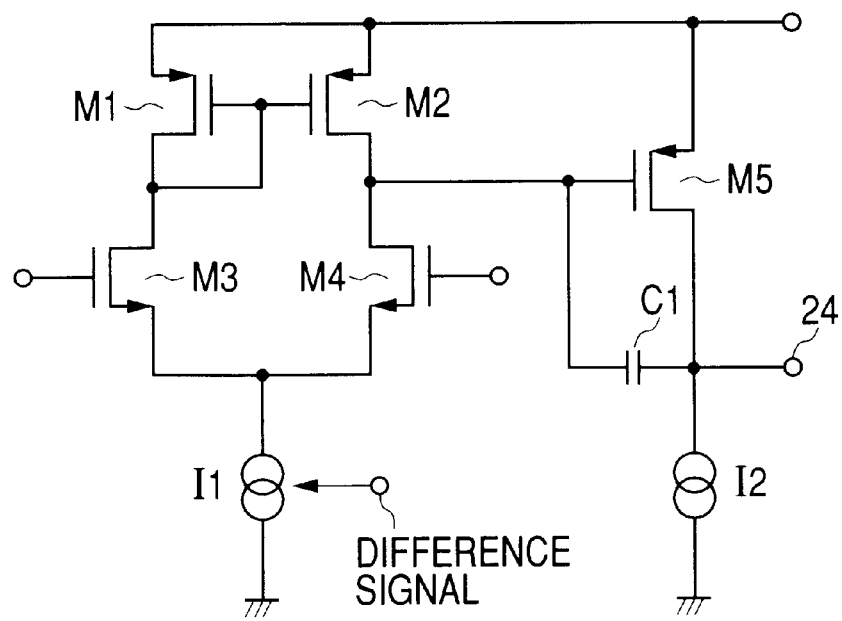
FIG. 6 is a circuit diagram showing a configuration of an example of a differential amplifier for use in the D/A converter shown in FIG. 5.
Figure 7:
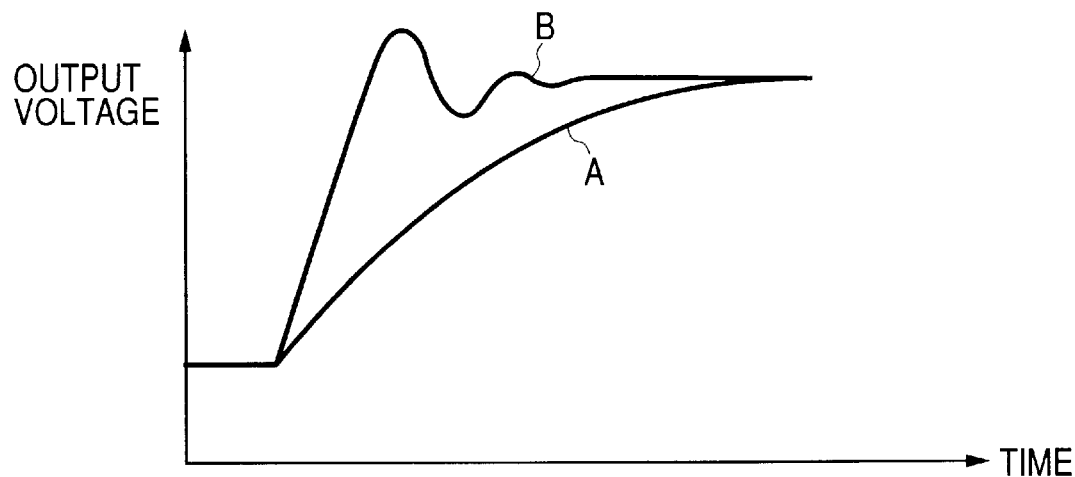
FIG. 7 is a graphical representation useful in explaining the change in the transient response characteristics due to a bias current of the differential amplifier shown in FIG. 6.

FIG. 6 is a circuit diagram showing a configuration of a typical example of the differential amplifier 22 shown in FIG. 5. While symbols I1 and I2 denote bias current sources, respectively, and symbol Cl denotes a phase compensation capacitor. The value of the bias current I1 is changed so that as shown in FIG. 7, the transient response of the output signal of the differential amplifier 22 is changed. That is, if the level of the bias current is reduced, then the gentle response which is free from the ringing as shown in a curve A in FIG. 7 is obtained, while the level of the bias current is increased, then as shown in a curve B in FIG. 7, the high speed response can be obtained, while the ringing appears. By the way, in FIG. 6, symbols M1 to M5 designate MOS transistors, respectively.

Therefore, since until the time t1 of FIG. 2, the difference in magnitude between the analog input signal and the output signal of the D/A converter 2 is large, even if the ringing appears in the output signal of the D/A converter 2, there is no problem. Thus, the current of the bias current I1 shown in FIG. 6 is increased and also the response is made more rapid in accordance with the difference signal of the comparator 3, whereby the A/D conversion speed of FIG. 1 is enhanced. In addition, since on and after the time t1 of FIG. 2, the difference in magnitude between the analog input signal and the output signal of the D/A converter 2 is small, the control is carried out in such a way that the current of the bias current I1 shown in FIG. 6 is reduced in accordance with the difference signal of the comparator 3 so as to prevent the ringing from appearing in the output signal of the D/A converter 2.

Figure 8:
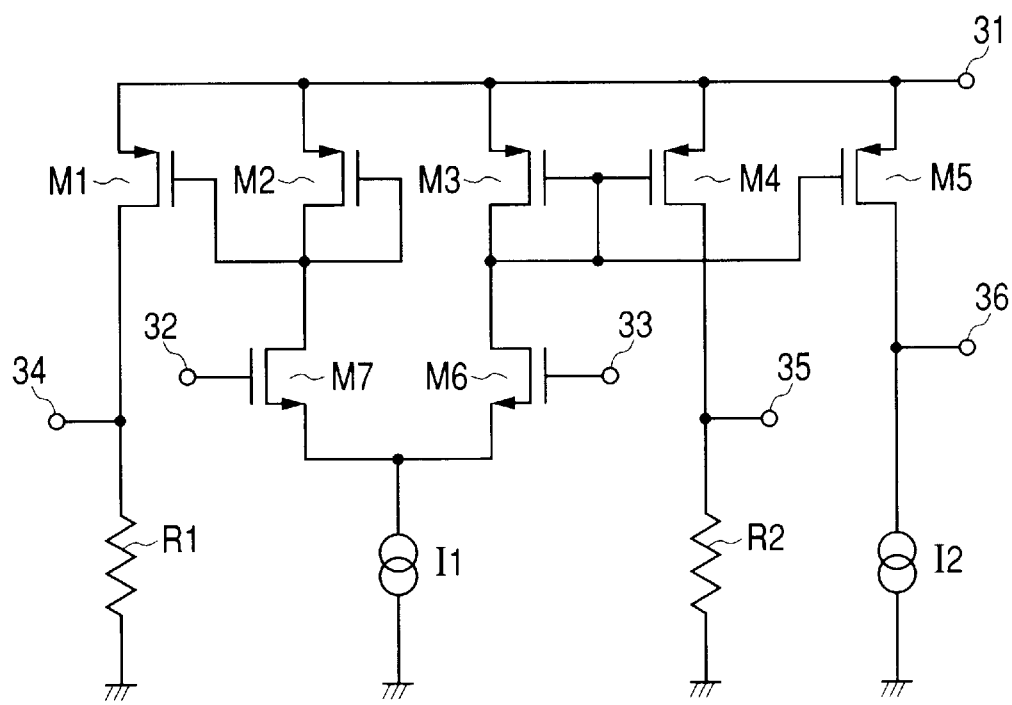
FIG. 8 is a circuit diagram showing a configuration of an example of a comparator for use in the A/D converter shown in FIG. 1.
Figure 9:
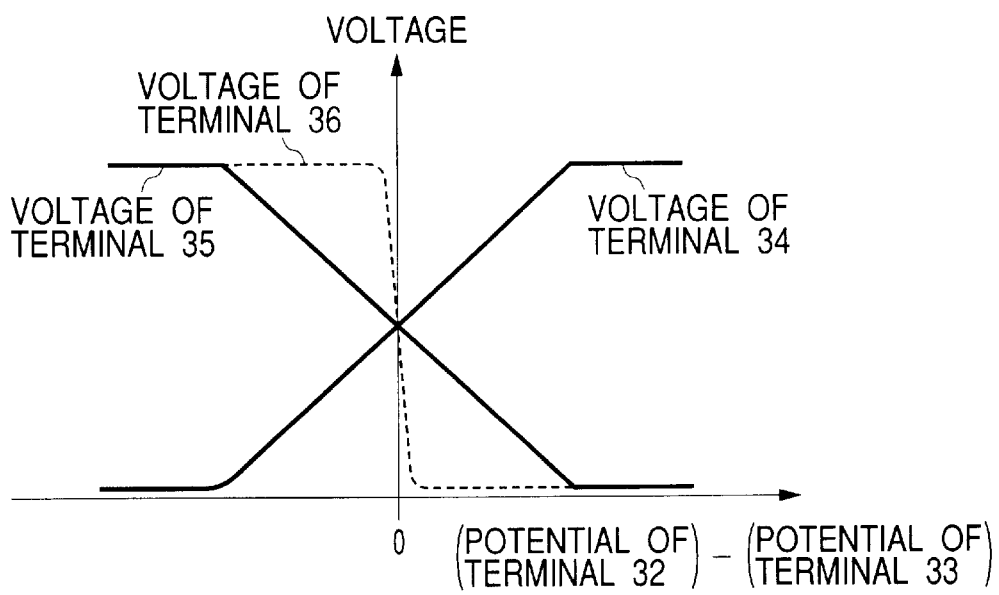
FIG. 9 is a graphical representation explaining the output signal change against an input signal to the comparator shown in FIG. 8.

FIG. 8 is a circuit diagram showing a configuration of an example of the comparator 3 shown in FIG. 1. In the figure, reference numeral 31 denotes a power source; reference numeral 32 denotes an input terminal having a positive polarity; reference numeral 33 denotes an input terminal having a negative polarity; reference numeral 34 denotes a positive polarity difference signal output terminal; reference numeral 35 denotes a negative polarity difference signal output terminal; reference numeral 36 denotes an output terminal; symbols M1 to M5, PMOS transistors; symbols M6 and M7, NMOS transistors; and I1 and I2, bias current sources. The analog input signal and the output signal from the D/A converter 2 are respectively inputted to the input terminals 33 and 32. At this time, as shown in FIG. 9, the electric potentials at the output terminals 34, 35 and 36 are changed in accordance with the magnitude of the difference between the electric potentials at the input terminal 32 and the electric potential at the input terminal 33. The difference signals of the output terminals 34 and 35 are respectively outputted to the input terminals 18 and 19 (refer to FIG. 3) of the counter 1, and the output signal at the output terminal 36 is outputted as the signal which is used for control of ON/OFF, to the counter 1. In addition, one of the difference signals of the comparator 3 is outputted as the signal which is used to control the bias current, to the D/A converter 2 (refer to FIG. 6).

Figure 10:
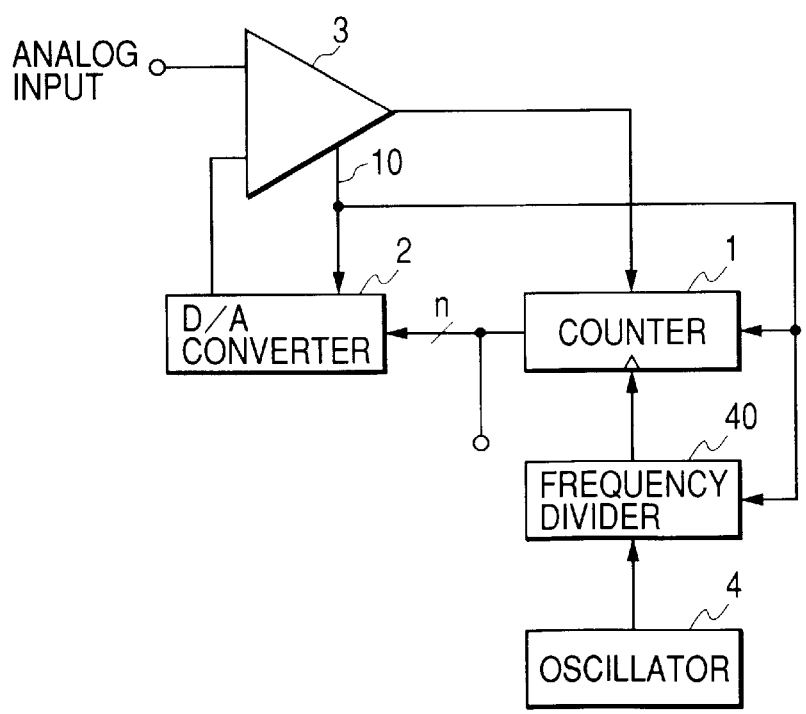
FIG. 10 is a circuit block diagram showing a configuration of a second embodiment of the A/D converter according to the present invention.

FIG. 10 is a circuit block diagram showing a configuration of a second embodiment of the A/D converter according to the present invention. In the present embodiment, a frequency divider 40 is additionally provided in the configuration of the first embodiment shown in FIG. 1 in order to frequency-divide the output signal of the oscillator 4 to input the resultant output signal to the counter 1. In the present embodiment, instead of controlling directly the clock cycle of the oscillator 4 using the difference signal output of the comparator 3, the frequency division rate of the frequency divider 40 is controlled, thereby offering the same effects as those of the first embodiment shown in FIG. 1. Though the high accuracy oscillator made of a material such as quartz crystal is employed as the oscillator 4 in many cases and it is difficult to control directly the output clock signal thereof, in this case, since the frequency division rate of the frequency divider 40 can be controlled to change the clock frequency, this configuration is adapted to the practical use. It is noted that the circuit shown in FIG. 3 may be provided in the logic circuit of the frequency divider 40.

Figure 11:
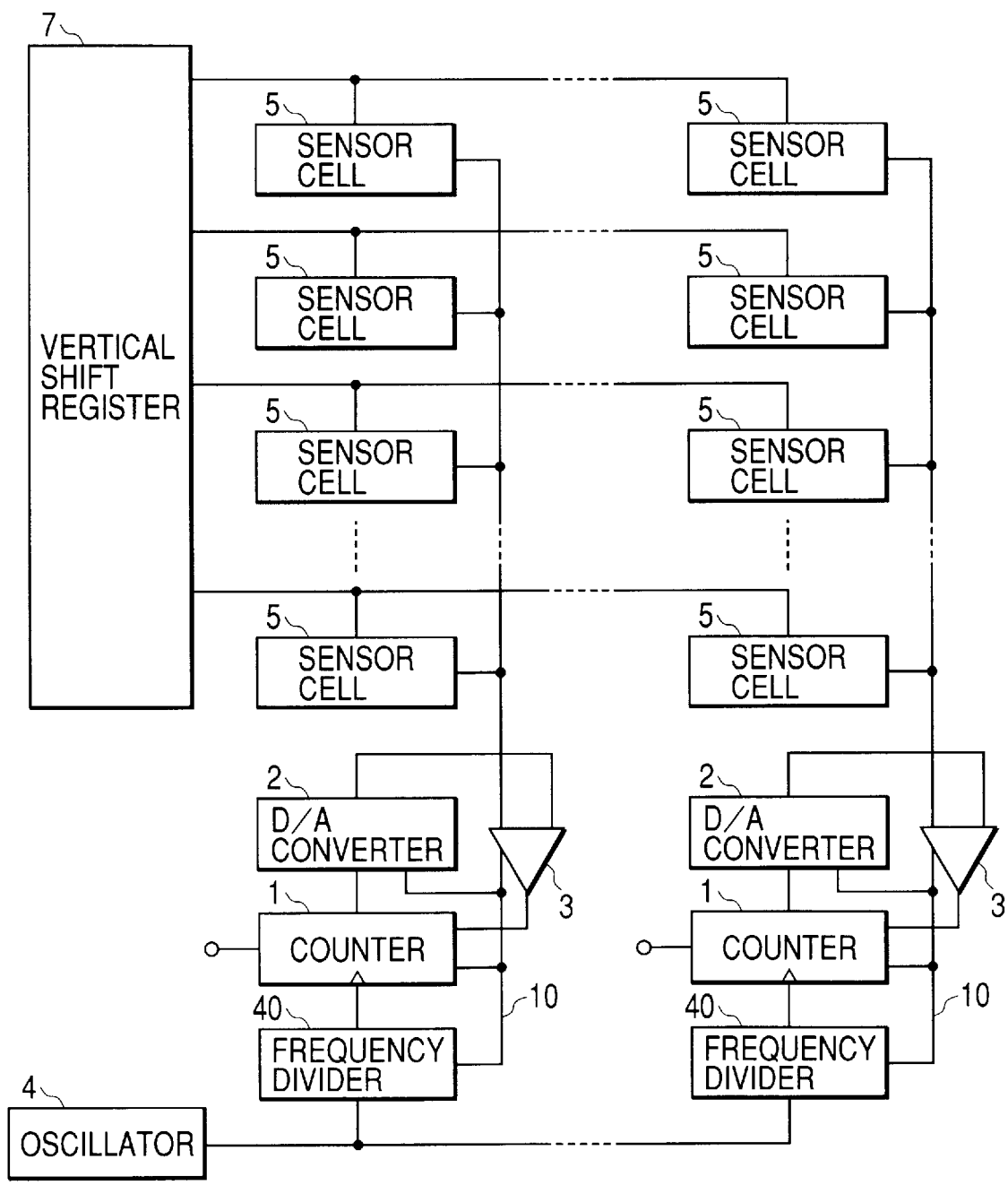
FIG. 11 is a circuit block diagram showing a configuration of an example of a solid-state image pickup apparatus employing the A/D converter shown in FIG. 10.

FIG. 11 is a circuit block diagram showing a configuration of an example of a solid-state image pick up apparatus employing the A/D converter shown in FIG. 10. While in this embodiment, an area sensor in which sensor cells are arranged in matrix of n (row)×m (column) in the two-dimensional manner is shown as an example, even in the case of a line sensor, the completely same operation and effects can be obtained. In the figure, reference numerals 5 denotes sensor cells which are arranged in matrix of n×m, reference numeral 7 denotes a vertical shift register, and reference numeral 4 denotes an oscillator the output signal of which is supplied to the frequency divider 40. Reference numeral 1 denotes a counter which is adapted to carry out the counting operation in response to the clock signal outputted from the frequency divider 40. Also, reference numeral 2 denotes the D/A converter which is adapted to receive the digital signal from the counter 1 to generate the analog signal corresponding thereto to input the analog signal thus generated to one input terminal of the comparator 3.

In addition, a signal denoted with reference numeral 10 is equal to the difference signal 10 of the comparator 3 shown in FIG. 10 and is outputted to the D/A converter 2, the counter 1 and the frequency divider 40 in a similar manner to that in FIG. 10. Both of the configuration and the operation of the A/D converter part shown in FIG. 11 are the same as those in FIG. 10 except that instead of the analog input signal in FIG. 10, a sensor signal output is inputted to the other input terminal of the comparator 3. In such a manner, by employing the A/D converter according to the above-mentioned embodiment, when subjecting the analog signal as the sensor output signal to the A/D conversion, it is possible to enhance the conversion speed and the conversion accuracy at the same time. It should be noted that while in the solid-state image pickup apparatus shown in FIG. 11, the A/D converter shown in FIG. 10 is substantially employed as the embodiment of the present invention, it is to be understood that the A/D converter shown in FIG. 1 may be employed instead.

Figure 12:
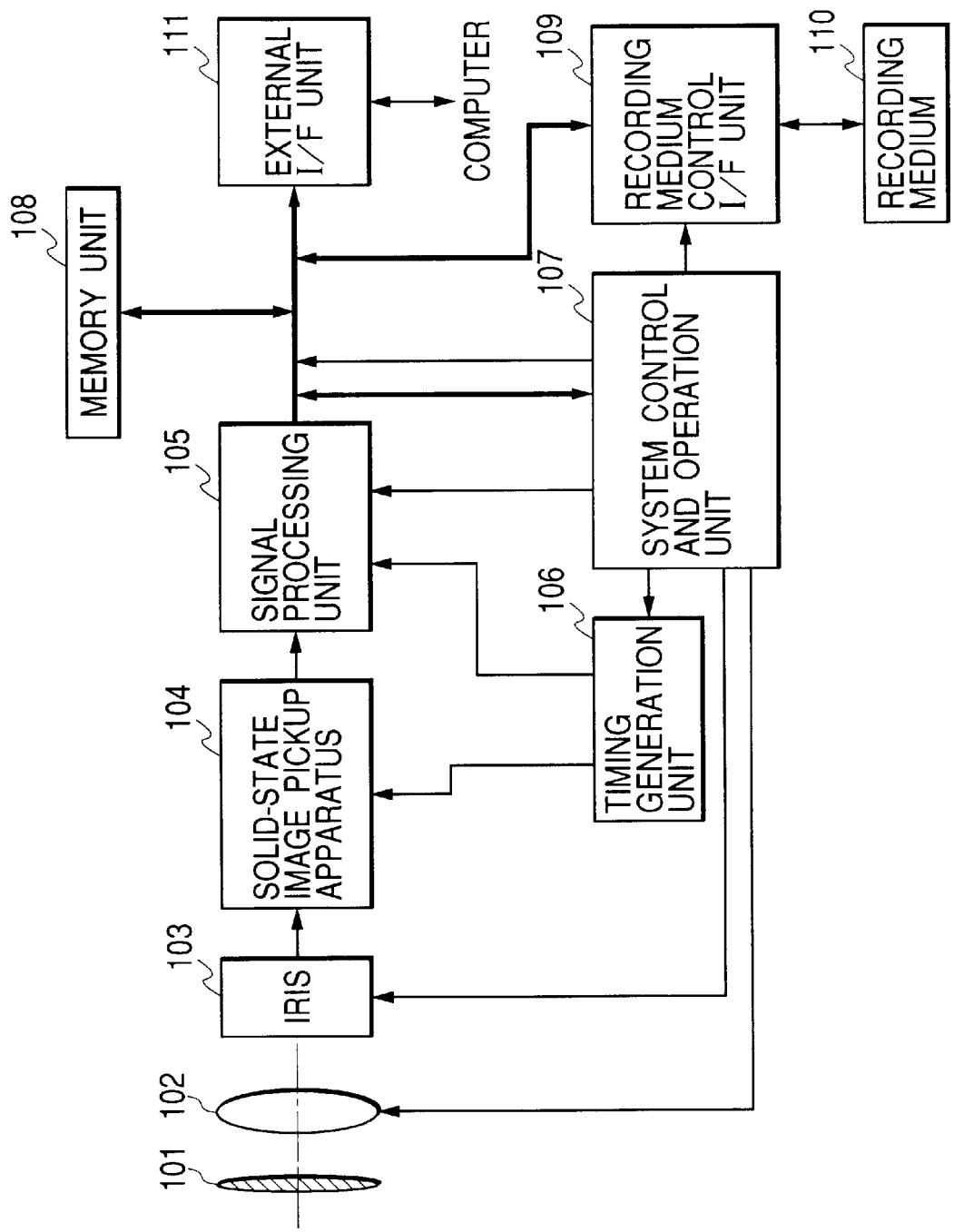
FIG. 12 is a block diagram showing a configuration of an image pickup system employing the solid-state image pickup apparatus shown in FIG. 11.

Next, the description will hereinbelow be given with respect to an image pickup system employing the solid-state image pickup apparatus shown in FIG. 11. FIG. 12 is a block diagram showing a configuration of an example of an image pickup system in the case where the solid-state image pickup apparatus shown in FIG. 11 is applied to a still camera. It should be noted that while the solid-state image pickup apparatus shown in FIG. 11 employs the A/D converter shown in FIG. 10, the solid-state image pickup apparatus of FIG. 11 may employ the A/D converter shown in FIG. 1 instead. In FIG. 12, reference numeral 101 denotes a barrier which serves as a protect as well as a main switch of a lens; reference numeral 102 denotes a lens for imaging an optical image of an object to be photographed on a solid-state image pickup apparatus 104; reference numeral 103 denotes a diaphragm for making variable an amount of light which passes through the lens 102; and reference numeral 104 denotes a solid-state image pickup apparatus for taking in the object which is imaged through the lens 102, in the form of image signals. The solid-state image pickup apparatus 104 is the solid-state image pickup apparatus employing the A/D converter of the first or second embodiment as described above. For example, it is now assumed that the solid-state image pickup apparatus shown in FIG. 11 is employed.

Now, the digital signals outputted from the counters 1 may be outputted in parallel from the counters, respectively. Instead, multiplexers are respectively provided in the output parts of the counters to output the digital signals from the counters successively.

Reference numeral 105 denotes a signal processing unit for carrying out the various kinds of corrections (the color correction and the like) for the image data outputted from the solid-state image pickup apparatus 104 and for compressing the data; reference numeral 106 denotes a timing generation unit for outputting the various kinds of timing signals to the solid-state image pickup apparatus 104 and the signal processing unit 105; reference numeral 107 denotes a system control and operation unit for controlling the various kinds of arithmetic operations and the overall still video camera; reference numeral 108 denotes a memory unit for storing therein temporarily the image data; reference numeral 109 denotes a recording medium control I/F unit for recording or reading out the data in or from a recording medium; reference numeral 110, a recording medium, such as a semiconductor memory, which is detachably attached and which is adapted to record or read out the image data; and 111, an external I/F unit through which the communication is carried out with an external computer or the like.

Now, the solid-state image pickup apparatus 104 and the signal processing unit 105 may be provided in the form of individual semiconductor chips or may also be formed on the same semiconductor chip through the CMOS process. In addition, there may also be adapted the configuration in which the solid-state image pickup apparatus 104 and the signal processing unit 105 are formed on the same semiconductor chip, and the signals of one line are outputted in parallel from the solid-state image pickup apparatus, and then the signal processing circuit processes the signals, which are outputted in parallel therefrom, in a parallel manner.

Next, the description will hereinbelow be given with respect to the operation during the photographing by the still video camera shown in FIG. 12. At the time when the barrier 101 is opened, the main power source is turned ON, and then the power source for the control system is turned ON, and then the power source for the image pickup system circuit is turned ON. Thereafter, in order to control an amount of exposure, the system control and operation unit 107 opens the diaphragm 103, and the signals outputted from the solid-state image pickup apparatus 104 are converted by the A/D converter provided inside to be inputted to the signal processing unit 105. The arithmetic operation for the exposure is carried out in the system control and operation unit 107 on the basis of that data. The brightness is judged on the basis of the result of carrying out the photometry, and then the system control and operation unit 107 controls the diaphragm in accordance with the judgment result.

Next, on the basis of the signal outputted from the solid-state image pickup apparatus 104, a high frequency component is extracted and the arithmetic operation for the distance up to the object is carried out in the system control and operation unit 107. Thereafter, the lens is driven to judge whether or not an in-focus state is obtained. If it is judged that the in-focus state is not obtained, then the lens is driven again to carry out the distance measurement. Then, after the in-focus state has been confirmed, the main exposure is started. At the time when the exposure is completed, the image signals outputted from the solid-state image pickup apparatus 104 are subjected to the A/D conversion in the A/D converter provided inside to pass through the signal processing unit 105 to be written to the memory unit 108 by the system control and operation unit 107. Thereafter, the data stored in the memory unit 108 passes through the recording medium control I/F unit 109 to be recorded in the detachable recording medium 110 such as a semiconductor memory under the control by the system control and operation unit 107. In addition, the data of interest may pass through the external I/F unit 111 to be directly inputted to a computer or the like in order to process the image therein.

As set forth hereinabove, according to the first and second embodiments, the frequency of the clock signal is changed in accordance with the difference signal exhibiting the difference between the analog input signal and the output signal of the D/A converter, whereby the A/D conversion accuracy and the conversion speed can be enhanced. In addition, the bias current of the output amplifier of the D/A converter is changed in accordance with the difference signal, whereby it is possible to suppress the generation of the ringing and also the A/D conversion accuracy and the conversion speed can be enhanced. Furthermore, the output impedance of the gate circuit of the counter or the frequency divider is changed in accordance with the difference signal, whereby it is possible to suppress the generation of the switching noise and also the A/D conversion accuracy can be enhanced. Also, the A/D converter as described above is employed in a solid-state image pickup apparatus, whereby it is possible to balance the high image quality and the high speed operation.

Although the present invention has been described with reference to specific embodiments, these descriptions are not meant to be construed in a limiting sense. Various modifications of the disclosed embodiments, as well as alternative embodiments of the invention will become apparent to persons skilled in the art upon reference to the description of the invention. It should be appreciated by those skilled in the art that the conception and the specific embodiments disclosed may be readily utilized as a basis for modifying or designing other configurations for carrying out the same purposes of the present invention. It should also be realized by those skilled in the art that such equivalent configurations do not depart from the spirit and scope of the invention as set forth in the appended claims.

It is therefore contemplated that the claims will cover any such modifications or embodiments that fall within the true scope of the invention.

What is claimed is:

1. An A/D converter comprising:
    a counter arranged to count a clock signal to output a digital signal corresponding to an analog input signal;
    a D/A converter arranged to convert the output signal of said counter into an analog signal;
    a clock supply circuit arranged to supply said counter with the clock signal; and
    a comparator arranged to compare the analog input signal with the output signal of said D/A converter and output independently according to a comparison result a first signal for controlling said counter and a second signal for controlling a frequency of the clock signal supplied by said clock supply circuit.

2. An A/D converter according to claim 1, wherein the second signal is a difference signal between the analog input signal and the output signal of said D/A converter.

3. An A/D converter according to claim 2, wherein said clock supply circuit includes an oscillator arranged to generate the clock signal and a frequency divider arranged to frequency-divide the clock signal, and changes a frequency division rate of said frequency divider in accordance with the difference signal.

4. An A/D converter according to claim 2, wherein the frequency of the clock signal is a first frequency when the difference signal is at a first level, and is a second frequency lower than the first frequency when the difference signal is at a second level lower than the first level.

5. An image pickup apparatus comprising:
    a plurality of photoelectric conversion units;
    a plurality of output units arranged to output the signals from said plurality of photoelectric conversion units in a parallel manner; and
    A/D converters as defined in claim 1, which are provided in said plurality of output units, respectively.

6. An image pickup apparatus according to claim 5, further comprising:
    a signal processing circuit arranged to process the signals from said A/D converters; and
    a lens arranged to focus light onto said plurality of photoelectric conversion units.

7. An A/D converter comprising:
    a counter arranged to count a clock signal to output a digital signal corresponding to an analog input signal;
    a D/A converter including an output amplifier arranged to convert the output signal of said counter into an analog signal;
    a clock supply circuit arranged to supply said counter with the clock signal; and
    a comparator arranged to compare the analog input signal with the output signal of said D/A converter and output independently according to a comparison result a first signal for controlling said counter and a second signal for changing a bias current which flows through said output amplifier.

8. An A/D converter according to claim 7, wherein the second signal is a difference signal between the analog input signal and the output signal of said D/A converter.

9. An A/D converter according to claim 8, wherein the bias current which flows through said output amplifier has a first current value when the difference signal is at a first level, axed has a second current value smaller than the first current value when the difference signal is at a second level lower than the first level.

10. An image pickup apparatus comprising:
    a plurality of photoelectric conversion units;
    a plurality of output units arranged to output the signals from said plurality of photoelectric conversion units in a parallel manner; and
    A/D converters as defined in claim 7, which are provided in said plurality of output units, respectively.

11. An image pickup apparatus according to claim 10, further comprising:
    a signal processing circuit arranged to process the signals from said A/D converters; and
    a lens arranged to focus light onto said plurality of photoelectric conversion units.

12. An A/D converter comprising:
    a counter arranged to count a clock signal to output a digital signal corresponding to an analog input signal;
    a D/A converter arranged to convert the output signal of said counter into an analog signal;
    a clock supply circuit arranged to supply said counter with the clock signal,
    wherein at least one of said counter and said clock supply circuit includes a gate circuit whose output impedance changes in accordance with a difference signal exhibiting the difference between the analog input signal and the output signal of said D/A converter; and a comparator arranged to compare the analog input signal with the output signal of said D/A converter and output independently in accordance with a comparison result a first signal for controlling said counter and a second signal for changing the output impedance of said gate circuit.

13. An A/D converter according to claim 12, wherein the second signal is a difference signal between the analog input signal and the output signal of said D/A converter.

14. An A/D converter according to claim 13, wherein a gate circuit which is included in at least one of said counter and said clock supply circuit has a first impedance when the difference signal is at a first level, and has a second impedance smaller than the first impedance when the difference signal is at a second level lower than the first level.

15. An A/D converter according to claim 13, wherein said clock supply circuit includes an oscillator arranged to generate the clock signal and a frequency divider arranged to frequency-divide the clock signal, and an impedance of a gate circuit included in said frequency divider is changed in accordance with the difference signal.

16. An image pickup apparatus comprising:

a plurality of photoelectric conversion units;

a plurality of output units arranged to output the signals from said plurality of photoelectric conversion units in a parallel manner; and A/D converters as defined in claim 12, which are provided in said plurality of output units, respectively.

17. An image pickup apparatus according to claim 16, further comprising:

a signal processing circuit arranged to process the signals from said A/D converters; and a lens arranged to focus light onto said plurality of photoelectric conversion units.

* * * * *